United States Patent
Klauk et al.

(10) Patent No.: US 7,067,840 B2
(45) Date of Patent: Jun. 27, 2006

(54) METHOD AND DEVICE FOR REDUCING THE CONTACT RESISTANCE IN ORGANIC FIELD-EFFECT TRANSISTORS BY EMBEDDING NANOPARTICLES TO PRODUCE FIELD BOOSTING

(75) Inventors: Hagen Klauk, Erlangen (DE); Günter Schmid, Hemhofen (DE)

(73) Assignee: Infineon Technologies AG, Munich (DE)

( * ) Notice: Subject to any disclaimer, the term of this patent is extended or adjusted under 35 U.S.C. 154(b) by 145 days.

(21) Appl. No.: 10/283,883

(22) Filed: Oct. 30, 2002

(65) Prior Publication Data

US 2003/0080426 A1 May 1, 2003

(30) Foreign Application Priority Data

Oct. 30, 2001 (DE) ................. 101 53 563

(51) Int. Cl.
*H01L 29/08* (2006.01)
(52) U.S. Cl. ........................................ 257/40
(58) Field of Classification Search .............. 257/40, 257/338, 343, 344
See application file for complete search history.

(56) References Cited

U.S. PATENT DOCUMENTS 5,574,291 A * 11/1996 Dodabalapur et al. ........ 257/40
5,705,826 A * 1/1998 Aratani et al. ................ 257/40
6,646,302 B1* 11/2003 Kan et al. ..................... 257/321

FOREIGN PATENT DOCUMENTS

WO 99/48337 9/1999

OTHER PUBLICATIONS

Johannes Schmitt et al.: "Metal Nanoparticle/polymer Superlattice Films: Fabrication and Control of Layer Structure", Adv. Mater., vol. 9, 1997, No. 1, pp. 61-65.*
Venkat Narayanan et al.: "Reduction of Metal-semiconductor Contact Resistance by Embedded Nanocrystals", 2000 International Electron Device Meeting Technical Digest, 2000 IEEE.*
Hagen Klauk et al.: A reduced complexity process for organic thin film transistorsl, Applied Physics Letters, vol. 76, No. 13, Mar. 27, 2000, pp. 1692-1694.*

* cited by examiner

*Primary Examiner*—Leonardo Andujar
(74) *Attorney, Agent, or Firm*—Laurence A. Greenberg; Werner H. Stemer; Ralph E. Locher (57) ABSTRACT

A method for selectively doping an organic semiconductor material in the region of a contact area formed between a contact and the organic semiconductor material disposed thereon includes introducing the dopant with the aid of nanoparticles, the nanoparticles being disposed in a manner adjoining the contact area and, as a result, only a very narrow region of the organic semiconductor material being doped. The field increase effected by the nanoparticles results in a further reduction of the contact resistance.

8 Claims, 5 Drawing Sheets

METHOD AND DEVICE FOR REDUCING THE CONTACT RESISTANCE IN ORGANIC FIELD-EFFECT TRANSISTORS BY EMBEDDING NANOPARTICLES TO PRODUCE FIELD BOOSTING

BACKGROUND OF THE INVENTION

Field of the Invention

The invention relates to a method for fabricating a semiconductor device including at least one first body and a second body, which form a common contact area, one of the bodies being composed of an organic semiconductor material and the other body being composed of an electrically conductive contact material. Furthermore, the invention relates to a configuration in a semiconductor device that includes at least one contact composed of an electrically conductive material and a layer made of an organic semiconductor material, the layer being disposed on the contact so that a contact area is formed between contact and the layer made of the organic semiconductor material. The configuration fabricated by the method according to the invention has a reduced contact resistance when charge carriers cross between the two bodies.

Field-effect transistors are used as switches in electronic circuits. A semiconductor disposed between a source electrode and a drain electrode constructed from electrically conductive material in each case acts as an insulator in the switched-off state of the transistor, while a charge carrier channel forms under the influence of the field of a gate electrode in the switched-on state of the transistor. In such a case, electrical charge carriers are injected into the semiconductor layer at the source contact and extracted from the semiconductor layer at the drain contact so that an electric current flows from source to drain through the semiconductor layer or through the charge channel produced in the semiconductor layer.

Due to the different Fermi levels of semiconductor material and contact material, an asymmetrical diffusion process occurs at the contact area of the two materials. The different energy of the Fermi levels of the two materials gives rise to an energy difference, which is compensated for by the crossing of charge carriers. As a consequence, an interface potential builds up that, when an external potential difference is applied, counteracts crossing of the charge carriers between the two layers. A potential barrier is, thus, produced, which has to be surmounted by the charge carriers when entering into the semiconductor material from the electrically conductive contact or when emerging from the semiconductor material into the electrically conductive contact. In such a case, the tunneling current produced as a result of the charge carriers tunneling through the potential barrier is smaller, the higher or wider the potential barrier. A low tunneling current corresponds to a high contact resistance.

In semiconductor components based on inorganic semiconductors, doping the inorganic semiconductor in a boundary layer oriented toward the contact area combats an increase in the contact resistance. The doping alters the energy of the Fermi level in the inorganic semiconductor, i.e., the difference between the Fermi levels of contact material and semiconductor material decreases. As a consequence, either the potential barrier is reduced, as a result of which a significantly larger number of charge carriers pass over the potential barrier into the material opposite, or the potential barrier is narrowed, as a result of which the probability of charge carriers tunneling through the potential barrier increases. In both cases, the contact resistance is reduced on account of the doping.

In the fabrication of field-effect transistors based on amorphous or polycrystalline silicon layers, the contact regions are doped by the introduction of phosphorus or boron to the silicon layer near the source and drain contacts. The phosphorus or boron atoms are incorporated into the silicon network and act as charge donors or charge acceptors, thereby increasing the density of the free charge carriers and, thus, the electrical conductivity of the silicon in the doped region. This reduces the difference between the Fermi levels of contact material and doped semiconductor material. In such a case, the doping substance is introduced into the silicon only in the region of the source and drain contacts, but not in the channel region in which a charge carrier channel forms under the influence of the field of the gate electrode. Because phosphorus and boron form covalent bonds with the silicon, there is no risk of these atoms diffusing into the channel region so that a low electrical conductivity in the channel region is, furthermore, guaranteed.

If the doping of the contact regions is high enough, the tunneling probability is already so high in the quiescent state that the junction between the contact material and the inorganic semiconductor material loses its blocking capability and becomes readily conductive in both directions.

A further possibility for increasing the tunneling probability for a charge carrier transfer at the contact area lies in embedding nanoparticles at the contact area between the contact material and the semiconductor.

If the particle material and the contact material have different work functions or Fermi levels, then there arise, as described above, asymmetrical diffusion processes of charge carriers at an interface between the nanoparticles, on one hand, and the layer formed from the contact material, on the other hand. The resulting interface potential between the nanoparticles and the contact material is compensated for on account of the high electrical conductivities in the two materials to very short distances of a few tenths of nanometers. This leads to high electric field strengths between the nanoparticles and the contact material of the order of magnitude of about $10^7$ to $5 \times 10^7$ V/cm. Such an electric field, in turn, influences the Fermi levels in the semiconductor material disposed besides the nanoparticles and the contact material as third component at the contact area. The potential difference that builds up between contact material and semiconductor material, thus, decreases. The narrower potential barrier at the contact area increases the tunneling probability for the transfer of charge carriers and, thus, increases the tunneling current between the semiconductor and the contact material. An increased tunneling current means a reduction of the contact resistance. The effect is all the more pronounced, the larger the difference between the work function of the material of the nanoparticles and work function of the contact material.

Such a configuration is described for the reduction of the contact residence between an inorganic semiconductor and a metallic contact material by Narayanan et al., "Reduction of Metal-Semiconductor Contact Resistance by Embedded Nanocrystals," 2000 International Electron Device Meeting Technical Digest.

To fabricate a contact, firstly, a thin gold layer is vapor-deposited onto a silicon wafer and is converted subsequently into a layer of isolated gold nanoparticles by heating. In Such a case, for the material combination silicon/gold, the crystallization of the gold layer in the form of nanoparticles is promoted and controlled by reducing the surface energy on the silicon surface. After the formation of the nanoparticles, a layer of tungsten is deposited as contact material. For the contact resistance measured between the silicon wafer and the tungsten layer, a reduction by the factor 100 results from embedding the gold nanoparticles.

Field-effect transistors based on organic semiconductors are of interest for a multiplicity of electronic applications that require extremely low manufacturing costs, flexible or unbreakable substrates, or the fabrication of transistors and integrated circuits over large active areas. By way of example, organic field-effect transistors are suitable as pixel control elements in active matrix screens. Such screens are usually fabricated with field-effect transistors based on amorphous or polycrystalline silicon layers. The temperatures of usually more than 250° C. that are necessary for fabricating high-quality transistors based on amorphous or polycrystalline silicon layers require the use of rigid and fragile glass or quartz substrates. By virtue of the relatively low temperatures at which transistors based on organic semiconductors are fabricated, usually of less than 100° C., organic transistors allow the fabrication of active matrix screens using inexpensive, flexible, transparent, unbreakable polymer films, with considerable advantages over glass or quartz substrates.

A further area of application for organic field-effect transistors is the fabrication of highly cost-effective integrated circuits, as are used, for example, for the active marking and identification of merchandise and goods. These so-called transponders are usually fabricated using integrated circuits based on monocrystalline silicon, which leads to considerable costs in the construction and connection technology. The fabrication of transponders based upon organic transistors would lead to huge cost reductions and could help the transponder technology to achieve worldwide success.

One of the main problems in the application of organic field-effect transistors is the relatively poor electrical properties of the source and drain contacts, i.e., the high contact resistances thereof. The source and drain contacts of organic transistors are usually produced using inorganic metals or with the aid of conductive polymers, in order, thus, to ensure the highest possible electrical conductivity of the contacts. Most organic semiconductors that are appropriate for use in organic field-effect transistors have very low electrical conductivities. By way of example, pentazene, which is often used for fabricating organic field-effect transistors, has a very low electrical conductivity of $10^{-14}$ $\Omega^{-1}$ cm$^{-1}$. If the organic semiconductor has a low electrical conductivity, a large difference between the. Fermi levels of electrically conductive contact material and organic semiconductor material, therefore, exists at the contact area. Such a difference leads to the formation of a high potential barrier with a low tunneling probability for the passage of electrons. Therefore, source and drain contacts often have very high contact resistances, which has the effect that high electrical field strengths are necessary at the contacts to inject and extract charge carriers. A restrictive effect is, thus, brought about not by the conductivity of the contacts themselves, but by the conductivity of the semiconductor regions that adjoin the contacts and into or from which the charge carriers are injected or extracted.

To improve the electrical properties of the source and drain contacts, therefore, a high electrical conductivity of the organic semiconductor in the regions adjoining the contacts is desirable to reduce the difference in the Fermi levels between organic semiconductor and contact material and, thus, to lower the contact resistances. On the other hand, a high electrical conductivity of the organic semiconductor in the channel region adversely influences the properties of the transistor. An appreciable electrical conductivity in the channel region inevitably leads to high leakage currents, that is to say, to relatively high electric current intensities in the switched-off state of the field-effect transistor. For many applications, however, low leakage currents in the region of $10^{-12}$ A or less are indispensable. Moreover, a high electrical conductivity has the effect that the ratio between maximum switch-on current and minimum switch-off current turns out to be too small. Many applications require the largest possible ratio between switch-on current and switch-off current in the region of $10^7$ or greater because such a ratio reflects the modulation behavior and the gain of the transistor. Therefore, a low electrical conductivity of the organic semiconductor is necessary in the channel region, while a high electrical conductivity is necessary in the region of the source and drain contacts to improve the contact properties between organic semiconductor material and the material of the contacts.

As in the case of inorganic semiconductors, the electrical conductivity of many organic semiconductors can be increased by the introduction of suitable doping substances. Obtaining positional selectivity in the course of doping is problematic, however. The doping substances are not bound to a specific position in the organic semiconductors and can move freely within the material. Even if the doping process can originally be restricted to a specific region, for example, the regions around the source and drain contacts, the doping substances later migrate through the entire organic semiconductor layer, in particular, under the influence of the electric field applied between the source and drain contacts to operate the transistor. The electrical conductivity in the channel region is increased inevitably by the diffusion of the doping substances within the organic semiconductor layer.

SUMMARY OF THE INVENTION

It is accordingly an object of the invention to provide method and device for reducing the contact resistance in organic field-effect transistors by embedding nanoparticles to produce field boosting that overcomes the hereinaforementioned disadvantages of the heretofore-known devices and methods of this general type and that makes it possible to lower the contact resistance when charge carriers cross between the contact and the layer of the organic semiconductor material.

With the foregoing and other objects in view, there is provided, in accordance with the invention, a method for fabricating a semiconductor device having at least one first body and a second body, including the steps of constructing one of the first and second bodies from an organic semiconductor material and constructing another one of the first and second bodies from an electrically conductive contact material, the first and second bodies together forming a common contact area, providing activated nanoparticles on at least one section of an area of the first body, and depositing the second body on the at least one section of the area of the first body by forming the contact area, a doping being introduced by the activated nanoparticles into regions of the organic semiconductor material surrounding the activated nanoparticles and the activated nanoparticles undergoing transition to a deactivated form.

In the case of the method according to the invention, the nanoparticles are used as a carrier of an agent for doping the organic semiconductor material. The nanoparticles can be deposited selectively on at least one section of an area of the first body, the contact area between contact material and organic semiconductor material later being formed on the at least one section. The second body is deposited subsequently onto the at least one section of the area of the first body, with formation of the contact area. Preferably, the nanoparticles are applied only on the sections that later correspond to the contact areas. However, provided that no negative effects have to be accepted through a doping, the nanoparticles can also be applied in larger regions than the later contact areas. It is both possible for the first body to be composed of the contact material, the activated nanoparticles to be provided thereon, and, then, the second body to be deposited, which second body is composed of the organic semiconductor material, and the opposite case is also possible, in which firstly the first body is produced, which is constructed from the organic semiconductor material in this embodiment, then, the activated nanoparticles are provided on a section of an area of the first body, and, then, the second body is deposited, which is composed of the contact material in this case.

The activated nanoparticles have the effect that a chemical alteration occurs in the regions of the organic semiconductor material that adjoin their surface, which chemical alteration introduces a stationary doping into the organic semiconductor material. Because only the organic semiconductor material in the vicinity of the nanoparticles is selectively doped and the nanoparticles are disposed at the contact area, by the method according to the invention, only that region of the organic semiconductor material is doped in which charge carriers cross from or into the contact material, while no doping is effected in the remaining regions of the organic semiconductor. As a result, the contact resistance at the contact area can be significantly reduced, while the electrical properties of the organic semiconductor material are maintained in the other regions.

What is important to the method according to the invention is that the nanoparticles are provided in activated form, that is to say, in a form in which they can effect a chemical alteration of the organic semiconductor material disposed in their vicinity.

In such a case, the procedure may be such that the nanoparticles are already produced in activated form and are, then, deposited onto at least sections of an area of the first body. In such a case, the nanoparticle, itself, may be constructed from an active material that can react with the organic semiconductor material in the vicinity of the nanoparticle. Through reaction with the organic semiconductor material, the activated nanoparticle is converted into a deactivated form. However, it is also possible to load the nanoparticle with an activating compound that, then, reacts with the organic semiconductor material in the vicinity and, in the process, effects a doping of the organic semiconductor material. The nanoparticle, itself, experiences no chemical alteration in such a method variant. Intermediate forms of the two method variants are also possible, a nanoparticle present in an activated form additionally being loaded with an activating compound. The organic semiconductor material, then, experiences a doping both by the activated nanoparticle and by the activating compound. The nanoparticle can be loaded with the activating compound before or after the deposition of the nanoparticle on the section of the area of the first body.

In accordance with another mode of the invention, inactive nanoparticles are deposited on the at least one section of the area of the first body and the deposited nanoparticles are activated.

In accordance with a further mode of the invention, firstly, a precursor of the nanoparticle is deposited onto at least sections of the area of the first body and the nanoparticle is produced subsequently on the section of the area of the first body. In such a case, too, as already described above, the nanoparticle, itself, may be composed of an active material that can react with the organic semiconductor material in the vicinity of the nanoparticle and, thus, effect a doping, or the nanoparticle can be loaded with an activating compound during or after its fabrication, which compound then effects a doping of the organic semiconductor material surrounding the nanoparticle, the nanoparticle itself remaining chemically unaltered.

The precursors used for fabricating the nanoparticle may vary greatly. Thus, by way of example, it is possible, first, to produce a colloid from the material of the nanoparticle, which is subsequently coagulated. The coagulation can already take place from the colloidal solution and the resulting nanoparticles can, then, be separated, for example, by centrifugation, and cleaned. The nanoparticles are subsequently suspended, if appropriate, activated with an activating compound and, then, deposited on at least sections of the area of the first body. Depending on the method control, cleaning of the nanoparticles can also be dispensed with. It is also the case that the coagulation can be effected only after the deposition of the colloid on at least sections of the area of the first body, the nanoparticles being formed in the process. The latter, if necessary, can then be activated.

It is also possible to use other routes for fabricating nanoparticles. Thus, by way of example, a thin metal film can be deposited on the area of one of the bodies and the metal film can, then, be converted into the form of nanoparticles by the action of heat. Such a method is suitable, for example, for the fabrication of crystalline gold nanoparticles, if the first body is formed from a suitable material that, for example, has a sufficient thermal resistance. Furthermore, it is also possible to use substances that are already present in the form of nanoparticles. Examples are carbon modifications, such as fullerene rings, which can also be activated themselves, that is to say, for example, are present in an oxidized state, or else act as a way of transport for a compound that effects the doping in that they form, for example, an intercalation compound, for example, with a metal ion.

Nanoparticles in the sense of the invention are understood to be particles having a size of 0.1 nm to 5000 nm. The particles may have a spherical shape, that is to say, have the extents specified above in all three spatial directions. However, it is also possible to use two- or one-dimensional nanoparticles, which, then, have the form of discs or rods or tubes. The nanoparticles, then, have the dimensions specified above in one or two spatial directions, while the particles may also have a larger extent, for example, through to a plurality of micrometers, in the remaining dimensions.

The nanoparticles can be applied on the at least one section of the area of the first body in various ways, customary techniques normally being used. Thus, the nanoparticles can be applied by printing, for example, by inkjet printing or by screen-printing. However, the nanoparticles can also be sprayed through a shadowmask onto the at least one section of the area of the first body. Further methods, such as dipping methods or spin-on, are likewise possible. These methods can also be used analogously for the precursors of the nanoparticles.

The chemical properties of the nanoparticles are very diverse due to the possible materials that are used for fabricating the nanoparticles. This also results in a multiplicity of possible ways in which the nanoparticles can be converted into an activated form. Thus, in accordance with an added mode of the invention, the nanoparticles may be present in an oxidized form, which, after application to the at least one section of the area of the first body and the deposition of the second body, are reduced and, in the process, effect oxidation of the organic semiconductor material in the vicinity of the nanoparticles. Noble metal oxides or noble metal hydroxides are particularly suitable therefor. They oxidize the organic semiconductor layer and are, themselves, reduced to form metal particles. Examples of suitable noble metals are gold, silver, palladium, platinum, iridium, rhodium, and ruthenium.

If the nanoparticles are composed of a less reactive material, they can either be converted into a higher oxidation number, which exhibits a higher activity, by an oxidizing agent or be coated with an oxidizing agent that, then, effects oxidation of the organic semiconductor material. Thus, by way of example, it is possible to activate less reactive metallically conducting or semiconducting metal oxides by e.g. hydrogen peroxide, fluorine, chlorine, or bromine. Examples of such metal oxides are $RuO_2$, $TiO_2$, $SnO_2$, $In_2O_3$, $OsO_4$, and $SnO_2$. Such a type of activation always leads to a doping that is brought about by oxidation of the organic semiconductor material in the vicinity of the nanoparticles. It is particularly suitable for organic p-type semiconductor materials.

Doping by reduction is suitable for organic n-type semiconductor materials. Thus, by way of example, most of the transition group elements form non-stoichiometric hydrides, that is to say, they activate hydrogen. By way of example, if palladium nanoparticles are treated with hydrogen after their deposition but before the application of the organic semiconductor layer, the nanoparticles, after having been deposited, reduce the organic semiconductor material in their vicinity.

In accordance with an additional feature of the invention, the nanoparticles include one of a basic dopant and an acidic dopant diffusing into the organic semiconductor material in a vicinity of the nanoparticles and effecting one of deprotonation and protonation of the organic semiconductor material and the nanoparticles have an opposite basicity to the dopant.

The nanoparticles can also be activated such that they effect protonation or deprotonation of the organic semiconductor. To effect a stationary doping, the nanoparticles must have an acidity or basicity that impedes the diffusion of the dopant. In such a case, the nanoparticles may either be composed of a material that, itself, has a sufficiently high basicity or acidity, or they can be functionalized with ligands having acidic or basic properties.

Polyaniline doped with camphor sulfonic acid, for example, is sparingly soluble and is always present as a suspension with varying particle size. Such a suspension can be deposited on the at least one section of the area of the first body. After deposition of the organic nanoparticles, slight outdiffusion of the dopant camphor sulfonic acid into the organic semiconductor layer leads to a locally delimited doping. Due to the basicity of the polyaniline, the doping remains restricted to the immediate vicinity of the nanoparticles. Nanoparticles made of 3,4-polyethylene-dioxythiophene that has been doped beforehand with polystyrenesulfonic acid, for example, are also analogously suitable. Graphite or fullerene clusters are likewise suitable.

In accordance with yet another mode of the invention, binding sites to which the nanoparticle coordinates are provided on the at least one section of the area of the first body. Such a configuration enables selective deposition of the nanoparticle on the at least one section of the area of the first body. To such an end, it is possible to use, for example, a bifunctional ligand that has, at its ends, a respective group that can bind to the material of the first body or to the material of the nanoparticle. If the first body is formed as contact, for example, and is composed of a metallic contact material and if the nanoparticle is, likewise, composed of a metallic material, for example, a dithiol can be used as ligand. The dithiol, then, coordinates to the material of the contact with one of the thiol groups and to the nanoparticle with the other thiol group. As a result, the nanoparticle is fixed to the surface of the contact. To that end, the dithiol is, first, applied on the sections of the contact that later correspond to the contact area. Areas that are not formed by the contact are not coated with the dithiol. The dithiol may be applied, for example, by immersion in a solution of the dithiol, excess dithiol subsequently being washed away. The sections of the area of the contact are, then, coated with a monomolecular layer of the dithiol so that thiol groups are provided on the sections as coordination sites for the linkage of the nanoparticles. If a solution or a suspension of the nanoparticles is applied subsequently, the latter bind selectively to the free thiol groups, for which reason, after a rinsing step for removing unbound nanoparticles, only the contact area that has been coated with the dithiol beforehand is coated with the nanoparticles. The nanoparticles may, if appropriate, also be activated by corresponding ligands. Afterward the organic semiconductor material is deposited on the contact surface that is now provided with activated nanoparticles.

In terms of its structure, the ligand used for the selective deposition of the nanoparticles on the at least one section of the area of the first body is chosen in accordance with the materials from which the first body and the nanoparticles are constructed. Thus, by way of example, it is also possible to use ligands that carry, at one of their ends, a thiol group that can coordinate to a metal, for example, while an ionic group, for example, an amino group or a sulfonic acid group, which can effect coordination to a charged surface, is provided at the other end of the ligand. If correspondingly reactive groups, for example, hydroxyl groups, are present on one of the surfaces, the ligand can also be linked at one end through a silane.

In accordance with yet a further mode of the invention, the nanoparticles have a different work function than the contact material at least in a deactivated form of the nanoparticles.

Particular preference is attached to the use of nanoparticles that, at least in their deactivated form, have a different work function than the contact material. In such a case, a deactivated form is understood to be the state of the nanoparticle in which it is present after the introduction of the doping into the organic semiconductor material surrounding the nanoparticle. The difference in work function is chosen to be as large as possible in such a case. If the nanoparticles are composed, for example, of a metal, such as gold, and the contact material is composed of a metal, such as titanium, or an electrically conductive polymer, such as, for example, polyaniline doped with camphor sulfonic acid or poly(dioxyethylene)thiophene doped with polystyrenesulfonic acid, the work functions of the materials of which the nanoparticles and the contact are composed differ. The different work functions lead to differences in the electrical interface potentials of a few tenths of a volt, which are compensated for due to the high electrical conductivities both in the nanoparticles and in the contact material over extremely short distances of a few tenths of nanometers. As a result, high electric field strengths in the range from $1\times10^7$ to $5\times10^7$ V/cm, for instance, act at the interfaces between the nanoparticles and the contact material. The high electric field strengths also act on the organic semiconductor material, for which reason the width of the potential barrier at the interface between semiconductor and contact material is greatly reduced and, consequently, the tunneling current intensities are significantly increased. The consequence of the higher tunneling current intensities is a reduced contact resistance. In such a case, it is not necessary for the nanoparticles to form a closed layer. To obtain the highest possible tunneling current intensity, however, there must be the largest possible difference between the work function of the nanoparticle material and the work function of the contact material. As a result of the embedding of a layer of reactive nanoparticles at the contact area between organic semiconductor layer and contact material, therefore, the contact resistance is significantly reduced, on one hand, by the doping of the organic semiconductor material and, on the other hand, by the field boosting brought about by the different work functions.

The method according to the invention makes it possible to provide a semiconductor device that has a significantly reduced contact resistance in comparison with previously existing organic semiconductor devices. Therefore, the invention also relates to a configuration in a semiconductor device that includes at least one contact composed of a contact material and a layer made of an organic semiconductor material, the layer being disposed on the contact so that a contact area is formed between contact and the layer made of the organic semiconductor material, nanoparticles being disposed at the contact area and the organic semiconductor material in the vicinity of the nanoparticles having a doping.

With the objects of the invention in view, there is also provided a semiconductor device configuration, including at least one contact of a contact material, a layer of an organic semiconductor material, the layer disposed on the at least one contact to form a contact area therebetween, nanoparticles disposed at the contact area, and the organic semiconductor material having a doping in a vicinity of the nanoparticles.

The doping of the semiconductor material lowers the contact resistance between the contact and the layer of the organic semiconductor material. A field boosting brought about by the nanoparticles can additionally reinforce such an effect.

The organic semiconductor material is not inherently subject to any particular restrictions. Examples of suitable compounds that can be used are polyenes, such as anthracene, tetracene or pentacene, polythiophenes or oligothiophenes, and their substituted derivatives, polypyrroles, poly-p-phenylenes, poly-p-phenylvinylidenes, naphthalene-dicarboxylic dianhydrides, naphthaleneimides, polynaphthalenes, phthalocyanines, copper phthalocyanines or zinc phthalocyanines and their substituted, in particular, fluorinated, derivatives.

As contact material, in principle, all metals are suitable, preferably, palladium, gold, platinum, nickel, copper, aluminum, and also electrically conductive oxides, for example, ruthenium oxide and indium tin oxide, and also electrically conductive polymers, such as polyacetylene or polyaniline.

The material of which the nanoparticles are composed is, likewise, not inherently subject to any particular restrictions. The following are suitable, for example: noble metals, in particular, gold and platinum, metallically conducting or semiconducting metal oxides, for example, $RuO_2$, $TiO_2$, $SnO_2$, $In_2O_3$, or $SnO_2$. Also suitable are metallically conducting or semiconducting metal chalkogenides, for example, CdSe, CdTe, $Te_{39}As_{36}Si_{17}Ge_7P$, and $Ge_xSb_yTe_z$. Carbon modifications such as fullerenes or graphite are equally suitable. Furthermore, the nanoparticles may also be constructed from organic substances, for example, the above-mentioned organic conductors or semiconductors, in particular, polyaniline or 3,4-polyethylene-dioxythiophene.

The doping of the organic semiconductor material in the vicinity of the nanoparticle can be effected in various ways. For example, the doping may be a protonated or deprotonated form of the organic semiconductor material. Equally, the organic semiconductor material in the vicinity of the nanoparticles may be oxidized or reduced. Oxidation is suitable particularly for organic p-type semiconductors and reduction for organic n-type semiconductors. Furthermore, the doping can also be effected by forming a charge transfer complex constructed from the organic semiconductor material and the contact material. In this connection, charge transfer complex is understood to be a state in which the organic semiconductor partly releases charge carriers to an electron deficiency system (e.g., a noble metal oxide). The noble metal oxide, therefore, acts as acceptor A and the organic semiconductor as donor D. An $A^-D^+$ complex, therefore, arises at the contact area. What is crucial is that the electron transfer takes place only incompletely in such a case. A complete electron transfer would correspond to oxidation of the organic semiconductor and reduction of the noble metal oxide.

In accordance with yet an added feature of the invention, the nanoparticles are composed of a material that has a different work function than the contact material. As such, a field boosting can be achieved at the interface between contact material and organic semiconductor. As a result, the tunneling current intensity rises and the contact resistance can, thus, be lowered further.

A configuration as a field-effect transistor is particularly preferred, the contact forming the source electrode and/or drain electrode and the layer made of the organic semiconductor material being disposed between source electrode and drain electrode.

With the objects of the invention in view, there is also provided a field-effect transistor configuration, including at least one contact of a contact material forming at least one of a source electrode and a drain electrode of the field-effect transistor, a layer of an organic semiconductor material, the layer disposed on the at least one contact to form a contact area between the layer and the at least one contact and disposed between the source electrode and the drain electrode, nanoparticles disposed at the contact area, and the organic semiconductor material having a doping in a vicinity of the nanoparticles.

With the objects of the invention in view, in a semiconductor device, there is also provided a configuration including at least one contact of a contact material, a layer of an organic semiconductor material, the layer disposed on the at least one contact to form a contact area therebetween, nanoparticles disposed at the contact area, and the organic semiconductor material having a doping in a vicinity of the nanoparticles.

Other features that are considered as characteristic for the invention are set forth in the appended claims.

Although the invention is illustrated and described herein as embodied in a reduction of the contact resistance in organic field-effect transistors by embedding nanoparticles to produce field boosting, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
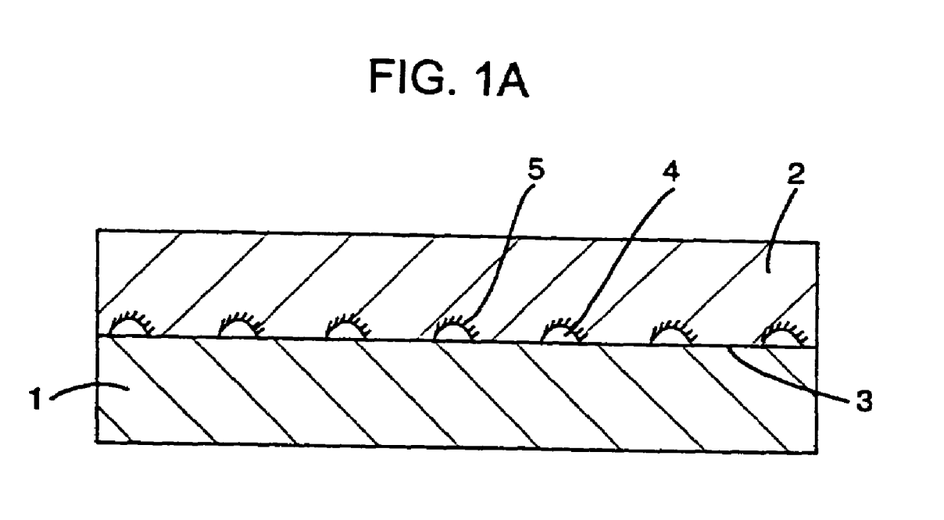
FIGS. 1A and 1B are fragmentary, cross-sectional views of a section perpendicular to a contact area formed between a contact and an organic semiconductor for two configurations of a semiconductor device according to the invention.
Figure 1B:
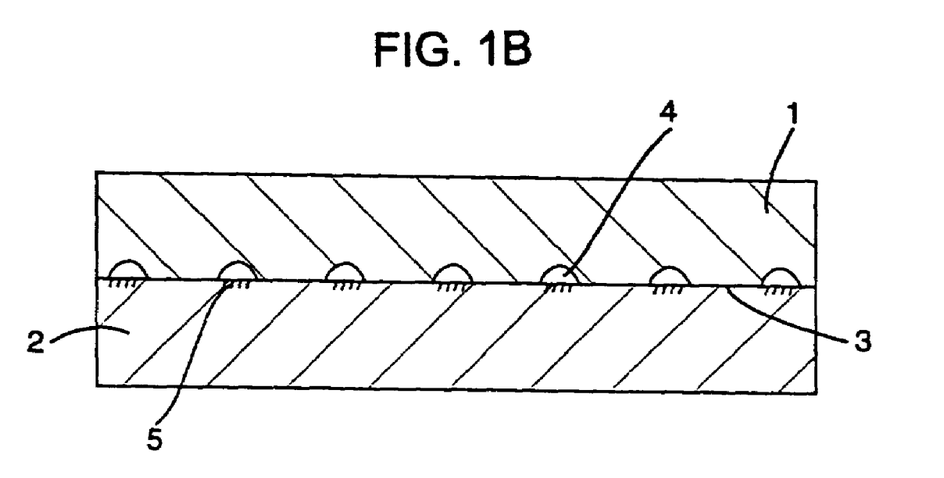

Referring now to the figures of the drawings in detail and first, particularly to FIGS. 1A and 1B thereof, there are shown two possible configurations for the configuration according to the invention in a semiconductor device. In FIG. 1A, a layer 2 made of an organic semiconductor material is disposed on a contact 1, which is composed of an electrically conductive material, for example, a metal, so that a contact area 3 is formed between contact 1 and organic semiconductor material 2. Nanoparticles 4 are disposed at the contact area 3. In this case, the configuration was fabricated such that the nanoparticles 4 were provided on the contact 1 on the contact area 3 and then the organic semiconductor material 2 was applied. In such a method variant, the contact material, thus, forms the first body in the sense of the invention. In the regions 5 surrounding the nanoparticles 4, a doping was introduced into the layer 2 of the organic semiconductor material by the nanoparticles 4. The doping was effected only in the regions near the contact area 3, while no doping took place in the regions of the layer 2 made of the organic semiconductor material that are remote from the contact area 3.

FIG. 1B illustrates the state obtained by a second method variant. In such a case, the first body in the sense of the invention is composed of the organic semiconductor material. The nanoparticles 4 were, therefore, deposited on the layer 2 made of organic semiconductor material. A contact area 3 is, again, formed between the layer 2 made of organic semiconductor material and the contact 1, disposed at the top in FIG. 1B. Nanoparticles 4 are disposed at the contact area 3, the nanoparticles 4 bearing on the layer 2 made of organic semiconductor material and being embedded by the contact material of the contact 1. A stationary doping of the organic semiconductor material was effected in regions 5 of the layer 2 made of organic semiconductor material.

Figure 2A:
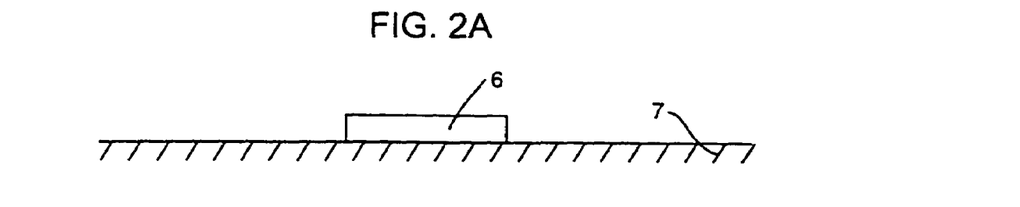
FIGS. 2A to 2E are fragmentary, cross-sectional views of steps passed through during the method according to the invention using an example of the fabrication of a field-effect transistor.
Figure 2B:
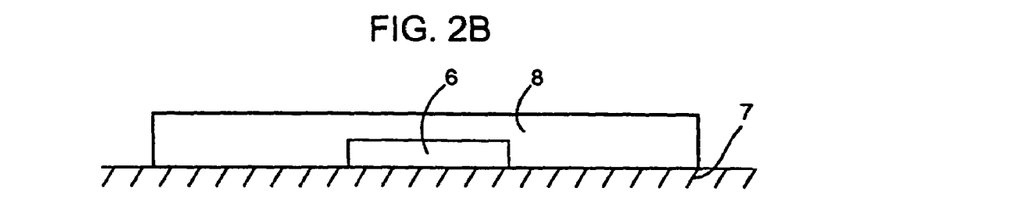
Figure 2C:
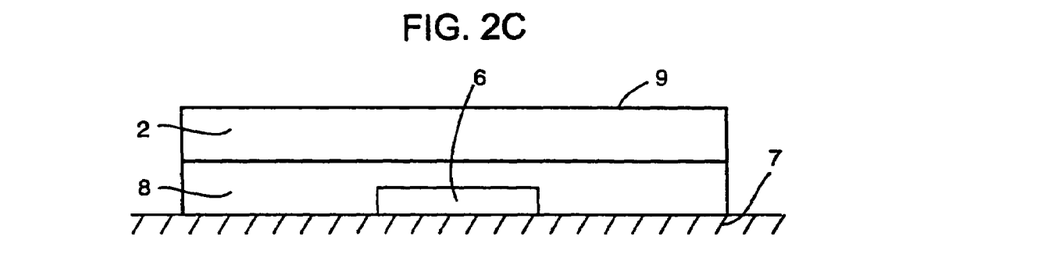
Figure 2D:
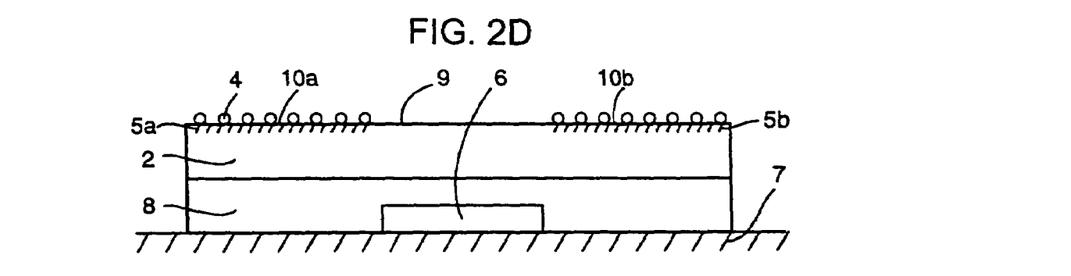
Figure 2E:
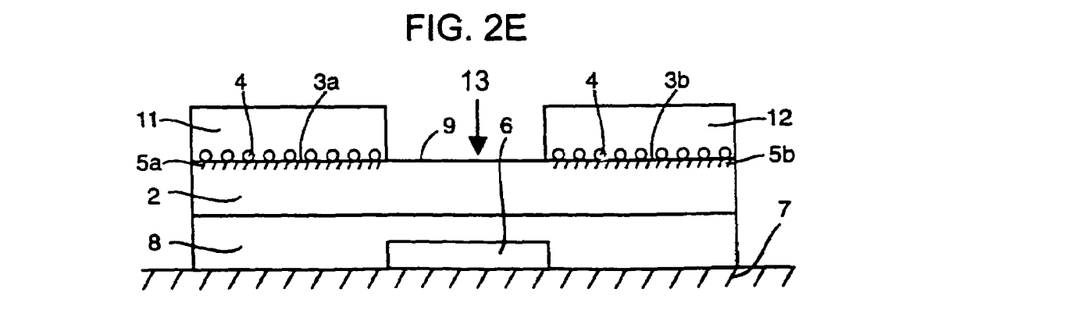

Using an example of the fabrication of an organic field-effect transistor, FIGS. 2A to 2E diagrammatically illustrate the steps that are passed through when carrying out the method according to the invention. Firstly, as illustrated in FIG. 2A, a gate electrode 6 is defined on a substrate 7. What are used as substrate 7 are, preferably, inexpensive, flexible polymer films based on polyethylene naphthalate, polyethylene terephthalate, polyethylene, polypropylene, polystyrene, epoxy resins, polyimides, polybenzoxazoles, polyethers, or their electrically conductively coated variants, and, also, flexible metal foils, glass, quartz, or electrically conductively coated glasses. The gate electrode 6 is composed of a conductive material, in particular, a conductive metal, for example, aluminum, and can be deposited, e.g., by vapor deposition. Afterward, as illustrated in FIG. 2B, the gate electrode 6 is insulated with a gate dielectric 8. By way of example, silicon dioxide or a nonconductive polymer can be used for such a purpose. A layer 2 made of an organic semiconductor material is subsequently deposited on the gate dielectric 8. In the configuration shown in FIG. 2C, the layer 2 of the organic semiconductor material has an uncovered area 9. On the area 9 of the layer 2 made of the organic semiconductor material, nanoparticles 4 are subsequently deposited, and, if appropriate, activated, in sections 10a, 10b that later form the contact areas 3a, 3b. A plurality of procedures is possible in this case. Thus, the nanoparticles 4 can be deposited directly on the sections 10a, 10b in that, by way of example, a solution or suspension of the nanoparticles 4 is applied on the sections 10a, 10b and the solvent is, then, evaporated. In such a case, the nanoparticles 4 may be deposited in already activated form, or be converted into an activated form following their deposition, for example, by treatment with hydrogen or an oxidizing agent. However, it is also possible, first, to deposit a colloidal precursor of the nanoparticles 4, which then coagulates to form the nanoparticles 4. In such a case, too, the nanoparticles 4 may be obtained directly in an activated form or be activated in a further step with a corresponding activating compound. The nanoparticles 4 bring about doping of the layer 2 made of organic semiconductor material in the regions 5a, 5b adjacent to the contact areas 10a, 10b. Finally, contacts in the form of source electrode 11 and drain electrode 12 are deposited, which are, preferably, composed of a metal, in particular, aluminum. The doping has taken place only in the regions 5a, 5b at the contact areas 3a, 3b, while the channel region 13, in which a charge carrier channel is produced under the action of the field generated by the gate electrode 6, remains free of dopings. In such an embodiment of an organic field-effect transistor, the nanoparticles 4 are deposited on sections 10a, 10b of the area 9 of the organic semiconductor layer 2. A configuration of the kind described in the case of FIG. 1B is, therefore, obtained.

FIGS. 3A to 3E show cross-sections through further embodiments of field-effect transistors that can be fabricated by the method according to the invention and include the semiconductor configuration according to the invention. The nanoparticles were deposited on sections of the area of the organic semiconductor layer during the fabrication of the field-effect transistor in the case of the configurations illustrated in FIGS. 3A and 3B, while the nanoparticles were deposited on the contacts in the case of the configurations shown in FIGS. 3C, 3D, and 3E.

Figure 3A:
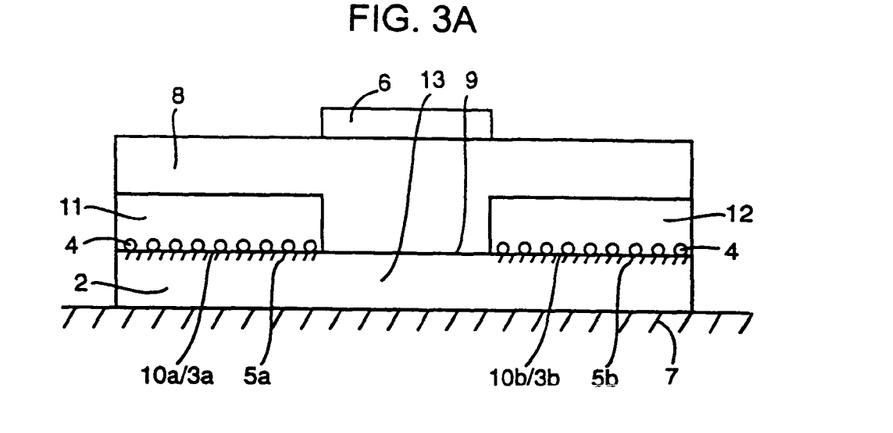
FIGS. 3A to 3E are fragmentary, cross-sectional views of various possible embodiments for a field-effect transistor according to the invention.

In the case of the configuration shown in FIG. 3A, firstly a layer 2 made of an organic semiconductor material was deposited on the substrate 7. On the layer 2, nanoparticles 4 are disposed in sections 10a, 10b of the area 9 of the organic semiconductor layer 2 that form the contact areas 3a, 3b. The nanoparticles 4 effect a doping of the layer 2 made of organic semiconductor material in the regions 5a, 5b adjacent to the contact areas 3a, 3b, while the channel region 13 remains undoped. The source electrode 11 and the drain electrode 12 are disposed as contacts on the sections 5a, 5b. A gate dielectric 8 is applied for the purpose of insulation on the source electrode 11, the drain electrode 12, and also the uncovered area of the layer 2 made of organic semiconductor material, a gate electrode 6, in turn, being disposed on the gate dielectric 8.

Figure 3B:
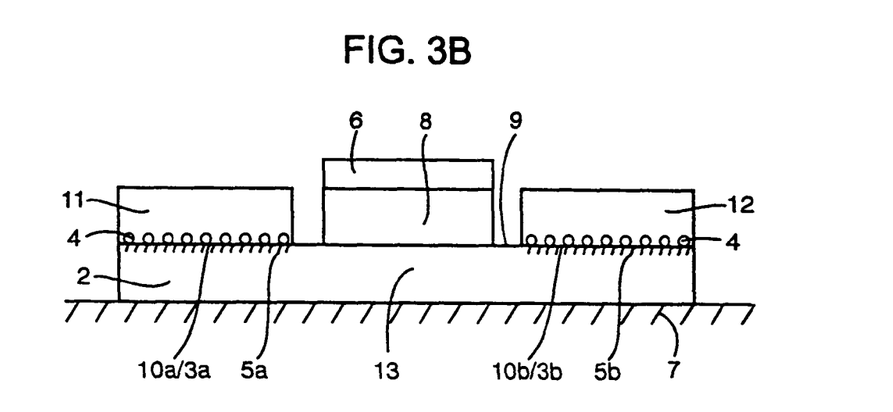

A modification of the field-effect transistor illustrated in FIG. 3A is shown in FIG. 3B. A layer 2 made of organic semiconductor material is disposed on the substrate 7. Nanoparticles 4 are disposed on the sections 10a, 10b of the area 9 of the layer 2 made of organic semiconductor material, which nanoparticles introduce a doping in the regions 5a, 5b of the layer 2 made of organic semiconductor material. The source electrode 11 and the drain electrode 12 are disposed as contacts on the sections 10a, 10b. In the region of the channel region 13, a gate dielectric 8 is applied to the layer 2 made of organic semiconductor material, the gate electrode 6 being insulated by the gate dielectric 8.

Figure 3C:
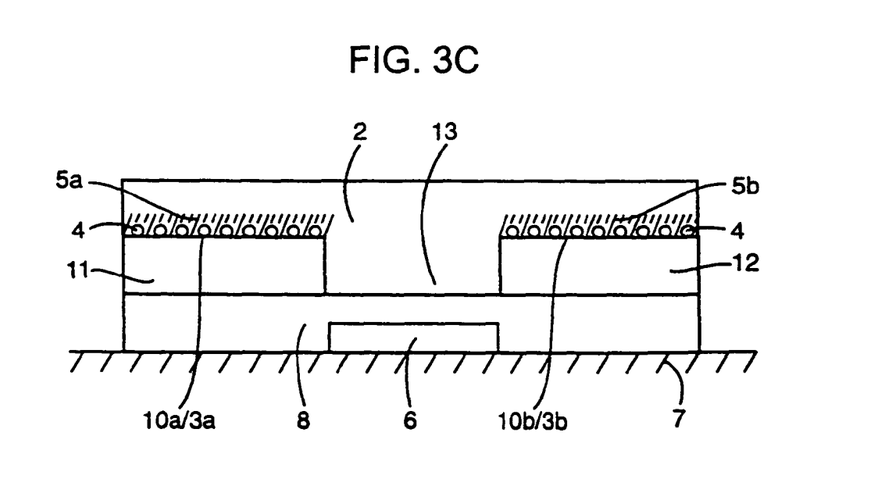
Figure 3D:
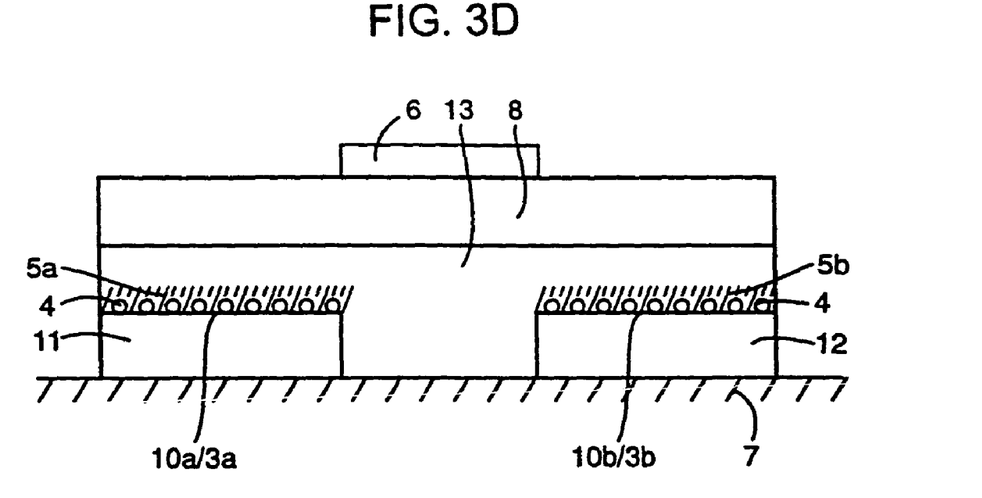

In the field-effect transistors illustrated in FIGS. 3C and 3D, the nanoparticles were provided on the contacts during the fabrication of the transistor. The configuration, therefore, corresponds to the configuration shown in FIG. 1B.

In FIG. 3C, a gate electrode 6 insulated by a gate dielectric 8 is disposed on a substrate 7. Source electrode 11 and drain electrode 12 are disposed as contacts on the gate dielectric 8 and, respectively, form contact areas 3a, 3b to the layer 2 made of organic semiconductor material that is disposed on the source electrode 11 and the drain electrode 12. Nanoparticles 4 are disposed at the contact area 3a, 3b, through the nanoparticles, a doping was introduced in the regions 5a, 5b of the layer 2 made of organic semiconductor material that are adjacent to the contact areas 3a, 3b. Doping is effected only adjacent to the contact areas 3a, 3b, while the region of the channel region 13 remains undoped, for which reason leakage currents are largely suppressed.

A configuration of a field-effect transistor in which the source electrode 11 and the drain electrode 12 are applied directly on the substrate 7 is shown in FIG. 3D. Nanoparticles 4 are, again, disposed on the sections 10a, 10b of the source electrode 11 and of the drain electrode 12, respectively, which form the contact areas 3a, 3b, which nanoparticles effect a doping in the regions 5a, 5b of the layer 2 made of organic semiconductor material that adjoin the contact areas 3a, 3b. The region of the layer 2 made of organic semiconductor material that is disposed between source electrode 11 and drain electrode 12 and that includes the channel region 13 is free of dopings and nanoparticles. A gate dielectric 8 is, again, disposed on the layer 2 made of organic semiconductor material, and the gate electrode 6 is disposed on the gate dielectric 8.

Figure 3E:
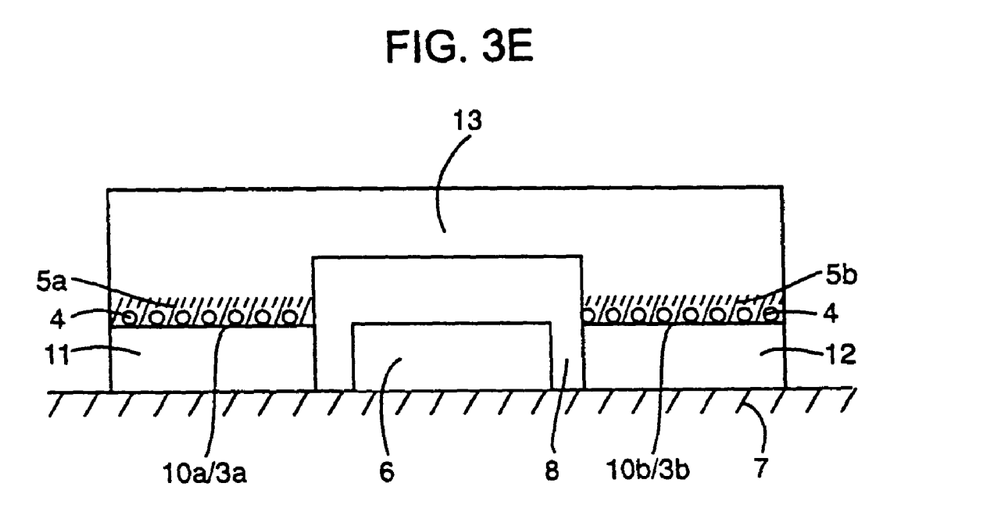

A further configuration, in which source electrode 11, drain electrode 12, and gate electrode 8 are disposed in one plane, is illustrated in FIG. 3E. This thin-film transistor requires only three steps for the deposition of the individual layers and was proposed by H. Klauk, D. J. Gundlach, M. Bonse, C. -C. Kuo and T. N. Jackson, *Appl. Phys. Lett.* 76, 2000, 1692–1694. First, a source electrode 11, a drain electrode 12, and a gate electrode 6 made of an electrically conductive material, in particular, a metal, for example, aluminum, are defined on a substrate 7 in a common work step. Afterward, the gate electrode 6 is insulated with a gate dielectric 8. Nanoparticles 4 in activated form are provided on the uncovered sections 10a, 10b of the source electrode 11 and the drain electrode 12 that later form the contact areas 3a, 3b. The layer 2 of the organic semiconductor material is deposited subsequently onto the nanoparticles 4 and, also, the uncovered areas of the gate dielectric 8. Through the action of the activated nanoparticles 4, regions 5a, 5b that have a doping and, thus, a higher conductivity are produced in the layer made of organic semiconductor material 2.

Figure 4:
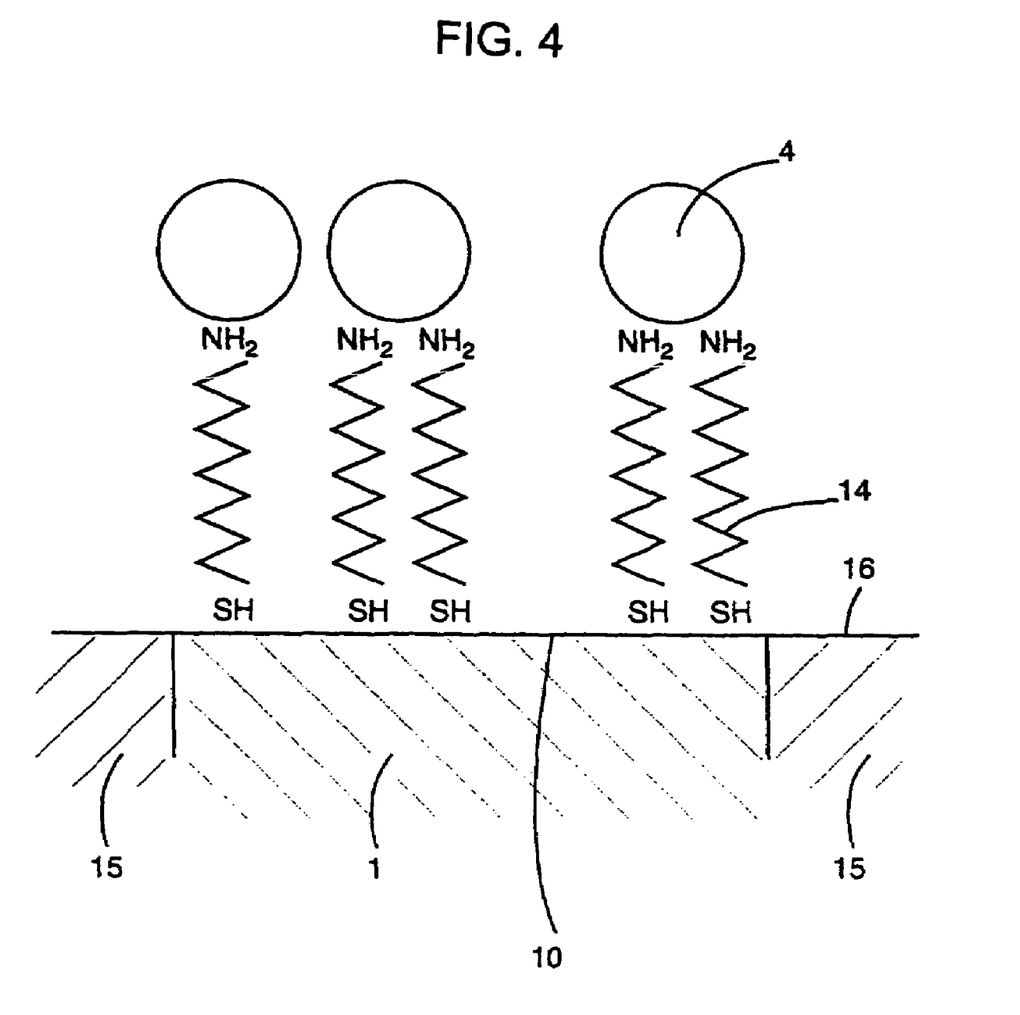
FIG. 4 is a fragmentary, cross-sectional view of a diagrammatic illustration showing the location-selective binding of nanoparticles according to the invention.

For the fabrication of the configuration according to the invention in a semiconductor device, it is important that the nanoparticles are applied at least in the sections that later form the contact areas between contact material and organic semiconductor material. Preferably, the nanoparticles are, therefore, applied selectively only in the sections that later form the contact areas. One possible way of enabling the nanoparticles to be fixed selectively in the desired sections is shown in FIG. 4. In such a case, the nanoparticles 4 are bound to the area 10 of the contact 1 through a ligand 14, which has two binding sites. This binding of the nanoparticles 4 to the area 10 of the contact 1 allows a spatially selective deposition of nanoparticles 4 on the surface of a substrate. FIG. 4 shows a contact 1 composed of a metal, for example. Thiol groups, for example, may be coordinated to the metal. Regions 15 composed of a material to which thiol groups do not coordinate adjoin on both sides of the contact 1. If a solution of the ligand 14 is, then, applied on the area 16 including sections 10 that are formed by the contact 1 and sections that are formed by the regions 15, only the regions with the ligand 14 are selectively coated, which correspond to the contact area 10, while the surface of the regions 15 remains uncoated. For such a purpose, the ligand 14 has two terminal groups that can coordinate to metals, for example. In the figure, the ligand 14 carries a thiol group at one of its ends, while an amino group is provided at the other end. The ligand 14, then, coordinates selectively with its thiol group at the area 10 of the contact 1. The amino groups disposed at the other end of the ligand 14 project away from the area 10. As a result, the area 10 is now coated with amino groups, which effects a significant chemical differentiation between the regions of the area 16 that are formed by the regions 15 and the area 10 of the contact 1. If a suspension of nanoparticles 4 that can form a bond with amino groups is, then, applied, the nanoparticles 4 are bound selectively in the regions of the contact 1 on the area 10, while the regions 15 remain free of nanoparticles 4. If the organic semiconductor material is applied subsequently, the nanoparticles 4 are fixed at the contact area formed by the area 10 between contact 1 and the layer made of organic semiconductor material.

EXAMPLE

A layer of aluminum is applied to a substrate, composed, e.g., of glass or polyester film, after the cleaning of the substrate surface and is patterned in order to define the gate electrode. The deposition is effected, for example, by thermal vaporization, cathode ray sputtering, or printing. The patterning can be effected, for example, by photolithography, chemical etching, lift-off, or printing. Afterward, a layer of silicon dioxide, aluminum oxide, or insulating polymer is deposited as gate dielectric and patterned. A layer of the organic semiconductor is, then, deposited from the solution by printing or spin-on. To that end, a 5% strength solution of regio-regular poly(3-octyl)thiophene in chloroform is spun on at 2000 rpm and dried at 60° C. Afterward, from a second solution in the contact regions, a thin layer of gold nanoparticles, which are activated by an $H_2O_2$ solution or a $Br_2$ solution, is printed onto the organic semiconductor layer, with subsequent driving-out of the solvent at 100° C. Afterward, a layer of palladium is applied over the layer of nanoparticles to define the source and drain contacts.

We claim:

1. A semiconductor device configuration, comprising:
at least one contact of a contact material;
a layer of an organic semiconductor material, said layer disposed at said at least one contact to form a contact area therebetween;
nanoparticles disposed at said contact area; and
said organic semiconductor material having a doping in a vicinity of said nanoparticles, said doping being introduced by said nanoparticles, and said doping being selected from the group consisting of a protonated form of said organic semiconductor material, a deprotonated form of said organic semiconductor material, an oxidized form of said organic semiconductor material, a reduced form of said organic semiconductor material, and a charge transfer complex constructed from said organic semiconductor material and said contact material.

2. The configuration according to claim 1, wherein said nanoparticles are of a material having a different work function than said contact material.

3. The configuration according to claim 1, wherein:
said contact forms at least one of a source electrode and a drain electrode of a field-effect transistor; and
said layer of said organic semiconductor material is disposed between said source electrode and said drain electrode.

4. The configuration according to claim 1, wherein:
the configuration is a field-effect transistor;
said contact forms at least one of a source electrode and a drain electrode; and
said layer of said organic semiconductor material is disposed between said source electrode and said drain electrode.

5. In a semicondudtor device, a configuration comprising:
at least one contact of a contact material;
a layer of an organic semiconductor material, said layer disposed at said at least one contact to form a contact area therebetween;
nanoparticles disposed at the contact area; and
said organic semiconductor material having a doping in a vicinity of said nanoparticles, said doping being introduced by said nanoparticles, and said doping being selected from the group consisting of a protonated form of said organic semiconductor material, a deprotonated form of said organic semiconductor material, an oxidized form of said organic semiconductor material, a reduced form of said organic semiconductor material, and a charge transfer complex constructed from said organic semiconductor material and said contact material.

6. The configuration according to claim 5, wherein said nanoparticles are of a material having a different work function than said contact material.

7. The configuration according to claim 5, wherein:
said contact forms at least one of a source electrode and a drain electrode of a field-effect transistor; and
said layer of said organic semiconductor material is disposed between said source electrode and said drain electrode.

8. The configuration according to claim 5, wherein:
the configuration is a field-effect transistor;
said contact forms at least one of a source electrode and a drain electrode; and
said layer of said organic, semiconductor material is disposed between said source electrode and said drain electrode.

* * * * *